(12) United States Patent
Pandey et al.

(10) Patent No.: US 11,967,636 B2
(45) Date of Patent: Apr. 23, 2024

(54) LATERAL BIPOLAR JUNCTION TRANSISTORS WITH AN AIRGAP SPACER

(71) Applicant: GlobalFoundries U.S. Inc., Malta, NY (US)

(72) Inventors: Shesh Mani Pandey, Saratoga Springs, NY (US); Hong Yu, Clifton Park, NY (US)

(73) Assignee: Global Foundries U.S. Inc., Malta, NY (US)

( * ) Notice: Subject to any disclaimer, the term of this patent is extended or adjusted under 35 U.S.C. 154(b) by 205 days.

(21) Appl. No.: 17/680,434

(22) Filed: Feb. 25, 2022

(65) Prior Publication Data
US 2023/0120538 A1 Apr. 20, 2023

Related U.S. Application Data

(60) Provisional application No. 63/257,398, filed on Oct. 19, 2021.

(51) Int. Cl.
| | |
|---|---|
| *H01L 27/082* | (2006.01) |
| *H01L 27/102* | (2023.01) |
| *H01L 29/06* | (2006.01) |
| *H01L 29/66* | (2006.01) |
| *H01L 29/70* | (2006.01) |
| *H01L 29/735* | (2006.01) |

(52) U.S. Cl.
CPC ........ *H01L 29/735* (2013.01); *H01L 29/0649* (2013.01); *H01L 29/6625* (2013.01)

(58) Field of Classification Search
CPC .............. H01L 29/735; H01L 29/0649; H01L 29/6625; H01L 29/1008; H01L 29/66242; H01L 29/7317; H01L 29/737

USPC .......................................................... 257/593
See application file for complete search history.

(56) References Cited

U.S. PATENT DOCUMENTS

| | | |
|---|---|---|
| 6,972,466 B1 | 12/2005 | Liang et al. |
| 11,127,816 B2 | 9/2021 | Adusumilli et al. |
| 2012/0139009 A1 | 6/2012 | Ning et al. |
| 2015/0137185 A1 | 5/2015 | Camillo-Castillo et al. |
| 2016/0276807 A1 | 9/2016 | Cai et al. |
| 2020/0388694 A1* | 12/2020 | Cheng ............... H01L 29/6653 |

(Continued)

FOREIGN PATENT DOCUMENTS

WO 2019005109 A1 1/2019

OTHER PUBLICATIONS

European Patent Office, Extended European Search Report and Opinion issued in European Patent Application No. 22197936.2 dated Mar. 28, 2023, 9 pages.

*Primary Examiner* — Theresa T Doan
(74) *Attorney, Agent, or Firm* — Thompson Hine LLP; Francois Pagette

(57) ABSTRACT

Structures for a bipolar junction transistor and methods of fabricating a structure for a bipolar junction transistor. The structure includes a first terminal having a first raised semiconductor layer, a second terminal having a second raised semiconductor layer, and a base layer positioned laterally between the first raised semiconductor layer and the second raised semiconductor layer. The structure further includes a spacer positioned laterally positioned between the first raised semiconductor layer and the base layer. The spacer includes a dielectric material and an airgap surrounded by the dielectric material.

20 Claims, 8 Drawing Sheets

(56) References Cited

U.S. PATENT DOCUMENTS

2021/0057283 A1 2/2021 Posseme
2021/0257454 A1 8/2021 Adusumilli et al.

* cited by examiner

LATERAL BIPOLAR JUNCTION TRANSISTORS WITH AN AIRGAP SPACER

CROSS-REFERENCE TO RELATED APPLICATIONS

This application claims the benefit of U.S. Provisional Application No. 63/257,398, filed Oct. 19, 2021, which is hereby incorporated by reference herein in its entirety.

BACKGROUND

The disclosure relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector to define junctions. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. During operation, the emitter-base junction is forward biased, the collector-base junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates emitter-base and collector-base heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Improved structures for a bipolar junction transistor and methods of forming a structure for a bipolar junction are needed.

SUMMARY

In an embodiment, structure for a bipolar junction transistor is provided. The structure comprises a first terminal including a first raised semiconductor layer, a second terminal including a second raised semiconductor layer, and a base layer positioned laterally between the first raised semiconductor layer and the second raised semiconductor layer. The structure further comprises a spacer laterally positioned between the first raised semiconductor layer and the base layer. The spacer comprises a dielectric material and an airgap surrounded by the dielectric material.

In an embodiment, a method of forming a structure for a bipolar junction transistor is provided. The method comprises forming a base layer, and forming a first terminal including a first raised semiconductor layer and a second terminal including a second raised semiconductor layer. The base layer is positioned laterally between the first raised semiconductor layer and the second raised semiconductor layer. The method further comprises forming a spacer laterally positioned between the first raised semiconductor layer and the base layer. The spacer comprises a dielectric material and an airgap surrounded by the dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
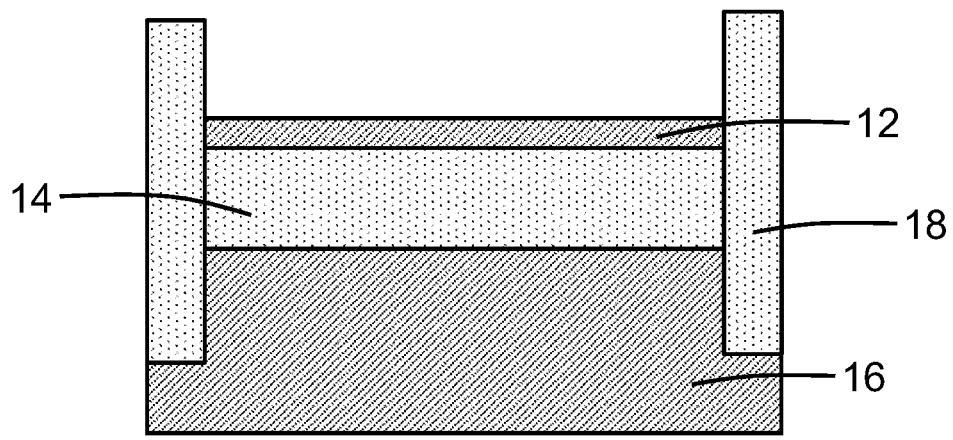
FIGS. 1-8 are cross-sectional views of a structure at successive fabrication stages of a processing method in accordance with embodiments of the invention.

With reference to FIG. 1 and in accordance with embodiments of the invention, a semiconductor-on-insulator substrate includes a device layer 12 defining a layer that contains a semiconductor material, a buried insulator layer 14, and a substrate 16. The device layer 12 is separated from the substrate 16 by the intervening buried insulator layer 14 and may also be considerably thinner than the substrate 16. In an embodiment, the device layer 12 may have a thickness in a range of about 4 nanometers (nm) to about 200 nm. In an embodiment, the device layer 12 may be used to fabricate fully-depleted silicon-on-insulator device structures.

The substrate 16 may be comprised of a semiconductor material, such as single-crystal silicon, and the buried insulator layer 14 may be comprised of a dielectric material, such as silicon dioxide, that is an electrical insulator. The buried insulator layer 14 electrically isolates the device layer 12 from the substrate 16. The buried insulator layer 14 has a lower interface with the substrate 16 and an upper interface with the device layer 12, and the lower and upper interfaces are separated by the thickness of the buried insulator layer 14.

Shallow trench isolation regions 18 are formed that penetrate through the device layer 12 and the buried insulator layer 14. The shallow trench isolation regions 18 may be formed by patterning shallow trenches with lithography and etching processes, depositing a dielectric material (e.g., silicon dioxide) to fill the shallow trenches, and planarizing and/or recessing the dielectric material.

Figure 2:
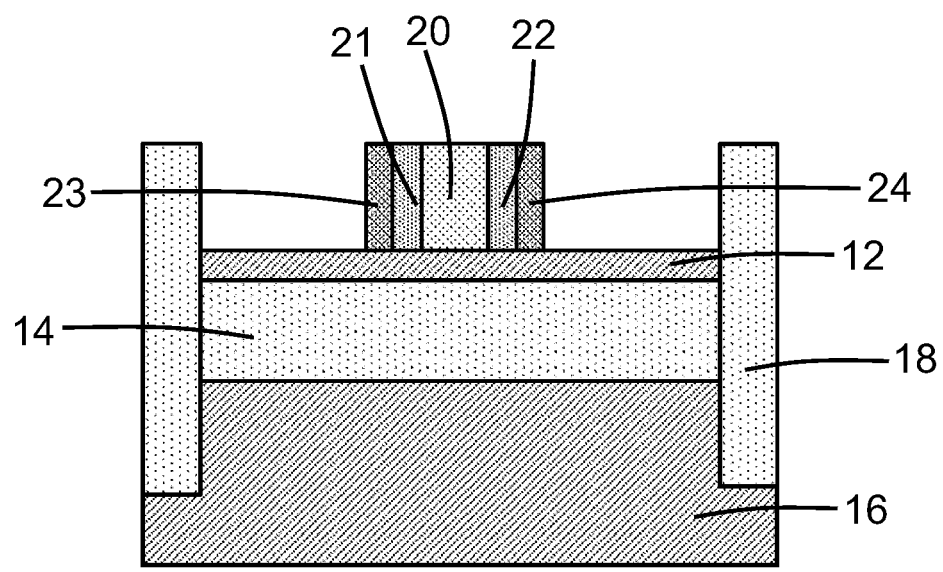

With reference to FIG. 2 in which like reference numerals refer to like features in FIG. 1 and at a subsequent fabrication stage, a base layer 20 is formed on the device layer 12. The base layer 20 may be comprised of a semiconductor material and, in an embodiment, the base layer 20 may be comprised of single-crystal semiconductor material that is epitaxially grown from the device layer 12. In an embodiment, the semiconductor material of the base layer 20 may be comprised at least in part of silicon-germanium including silicon and germanium with the silicon content ranging from 95 atomic percent to 50 atomic percent and the germanium content ranging from 5 atomic percent to 50 atomic percent. The germanium content of the base layer 20 may be uniform, or the germanium content of the base layer 20 may have a graded profile and/or a stepped profile across its thickness that may include portions that lack germanium. The base layer 20 may be in situ doped during epitaxial growth with a concentration of a dopant, such as a p-type dopant (e.g., boron) that provides p-type conductivity.

Inner spacers 21, 22 and outer spacers 23, 24 are formed on the sidewalls of the base layer 26. In an embodiment, the outer spacers 23, 24 may be comprised of a material that is removable selective to the material of the inner spacers 21, 22. The inner spacers 21, 22 may be comprised of a dielectric material, such as silicon nitride. The inner spacers 21, 22 may be formed by conformally depositing a layer of the constituent dielectric material and performing an anisotropic etching process. The outer spacers 23, 24, which are sacrificial, may be comprised of a dielectric material, such as silicon dioxide. The outer spacers 23, 24 may be formed by conformally depositing a layer of the constituent dielectric material and performing an anisotropic etching process.

Figure 3:
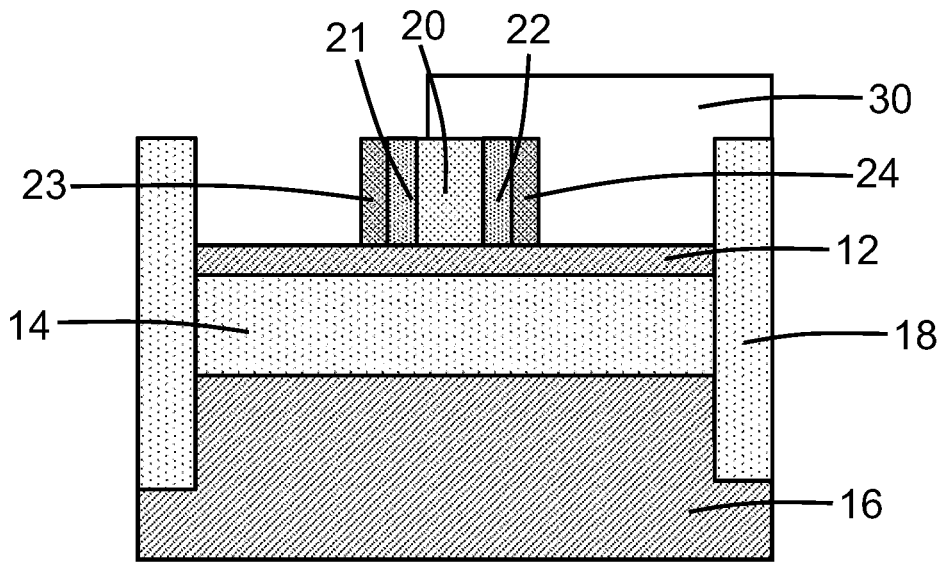

With reference to FIG. 3 in which like reference numerals refer to like features in FIG. 2 and at a subsequent fabrication stage, an etch mask 30 may be applied that covers the outer spacer 24 on one sidewall of the base layer 26 and that exposes the outer spacer 23 on an opposite sidewall of the base layer 26. A selective etching process may be used to remove the exposed outer spacer 23 without removing the adjacent inner spacer 21. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal process. The inner spacer 22 and the outer spacer 24 are covered by the etch mask 30 during the selective etching process. The etch mask 30 may be removed after removing the outer spacer 23.

Figure 4:
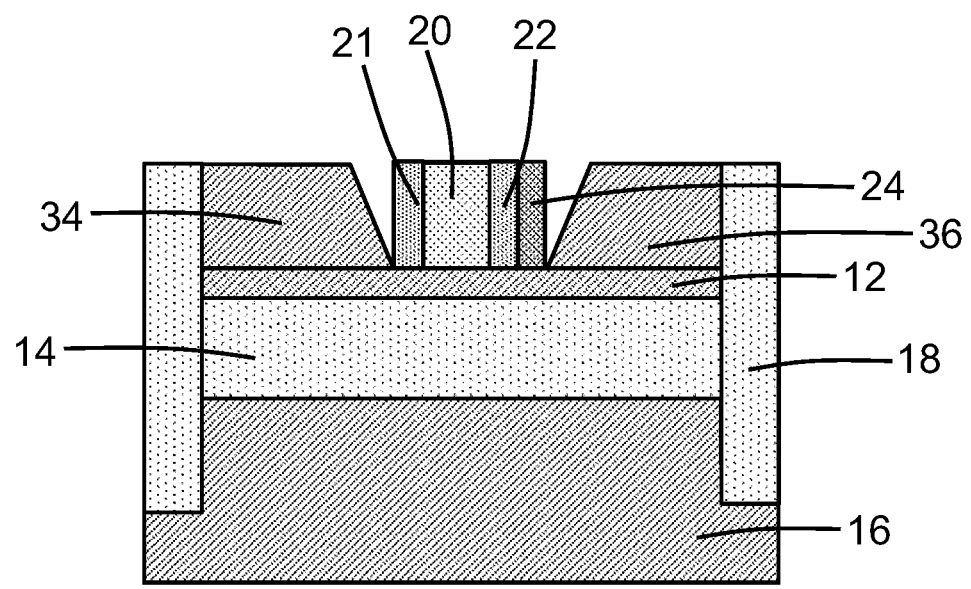

With reference to FIG. 4 in which like reference numerals refer to like features in FIG. 3 and at a subsequent fabrication stage, a raised semiconductor layer 34 and a raised semiconductor layer 36 are formed on sections of the device layer 12 adjacent to the opposite sidewalls of the base layer 26. The base layer 26 is positioned in a lateral direction between the raised semiconductor layer 34 and the raised semiconductor layer 36. The inner spacer 21 laterally separates the raised semiconductor layer 34 from the base layer 26, and the inner spacer 22 and the outer spacer 24 both laterally separate the raised semiconductor layer 36 from the base layer 26. The raised semiconductor layer 34 may be wider than the raised semiconductor layer 36 due to the removal of the outer spacer 23 before the raised semiconductor layers 34, 36 are formed.

The raised semiconductor layers 34, 36 may be comprised of a semiconductor material, such as silicon, and may be concurrently formed by an epitaxial growth process. The raised semiconductor layers 34, 36 may contain single-crystal semiconductor material (e.g., single-crystal silicon) and may be doped (e.g., heavily doped) with a concentration of a dopant, such as an n-type dopant (e.g., arsenic or phosphorus) to provide n-type conductivity. The epitaxial growth process may be selective in nature resulting in epitaxial growth from exposed semiconductor material and not from exposed dielectric material. The crystal structure of the single-crystal semiconductor material of the device layer 12 serves as a crystalline template during epitaxial growth of the raised semiconductor layers 34, 36. The raised semiconductor layers 34, 36 may grow with faceting (i.e., angled sidewalls) such that the raised semiconductor layer 34 is separated from the inner spacer 21 by an unfilled variable-width gap and the raised semiconductor layer 36 is separated from the outer spacer 24 by an unfilled variable-width gap. The raised semiconductor layers 34, 36 and the respective underlying sections of the device layer 12, which may receive diffused dopant from the raised semiconductor layers 34, 36, may provide terminals (i.e., an emitter and a collector) of the lateral bipolar junction transistor.

Figure 5:
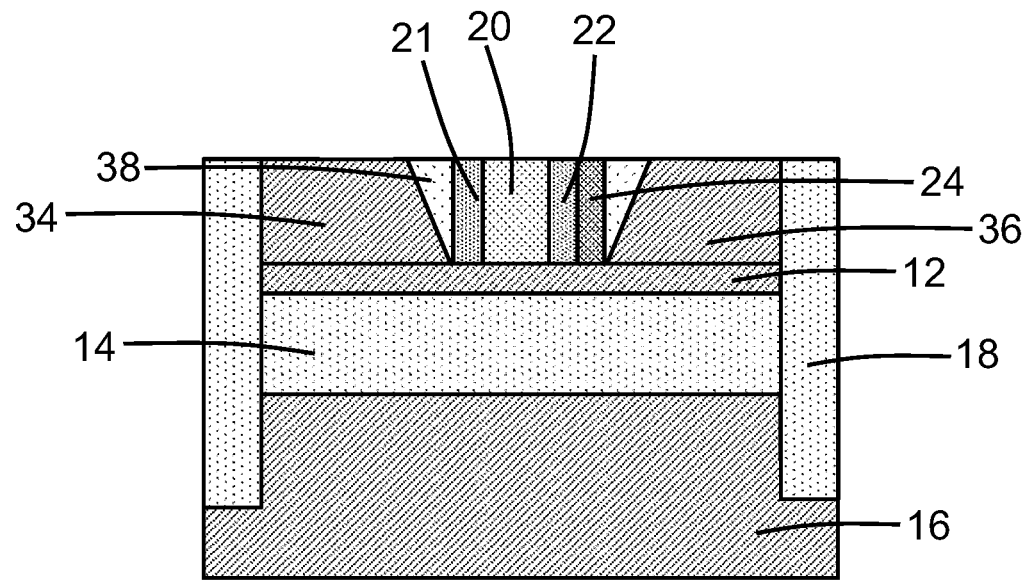

With reference to FIG. 5 in which like reference numerals refer to like features in FIG. 4 and at a subsequent fabrication stage, a dielectric layer 38 may be formed that has a section in the gap between the raised semiconductor layer 34 and the inner spacer 21 on one side of the base layer 26 and another section in the gap between the raised semiconductor layer 36 and the outer spacer 24 on the opposite side of the base layer 26. The dielectric layer 38 may be comprised of a dielectric material, such as a low-k dielectric material, that is deposited and planarized by chemical-mechanical polishing. In an embodiment, the dielectric layer 38 may fully fill the gaps, and may be solid and lack internal voids.

Figure 6:
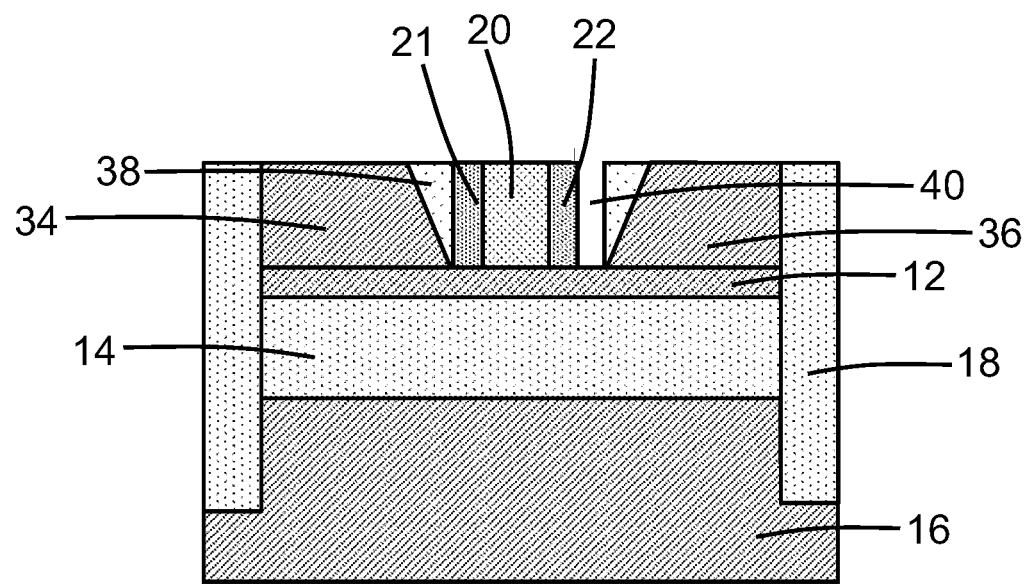

With reference to FIG. 6 in which like reference numerals refer to like features in FIG. 5 and at a subsequent fabrication stage, a selective etching process may be used to remove the outer spacer 24 without removing the inner spacer 21, the inner spacer 22 adjacent to the removed outer spacer 24, or the dielectric layer 38 in the gaps. A cavity 40 is created in the space from which the outer spacer 24 is removed. The cavity 40 may have the dimensions (e.g., height, width, and length) of the removed outer spacer 24. The cavity 40 is laterally arranged between the inner spacer 22 and the adjacent section of the dielectric layer 38, and the cavity 40 has an entrance adjacent to the exposed top surfaces of the base layer 20 and raised semiconductor layer 36.

Figure 7:
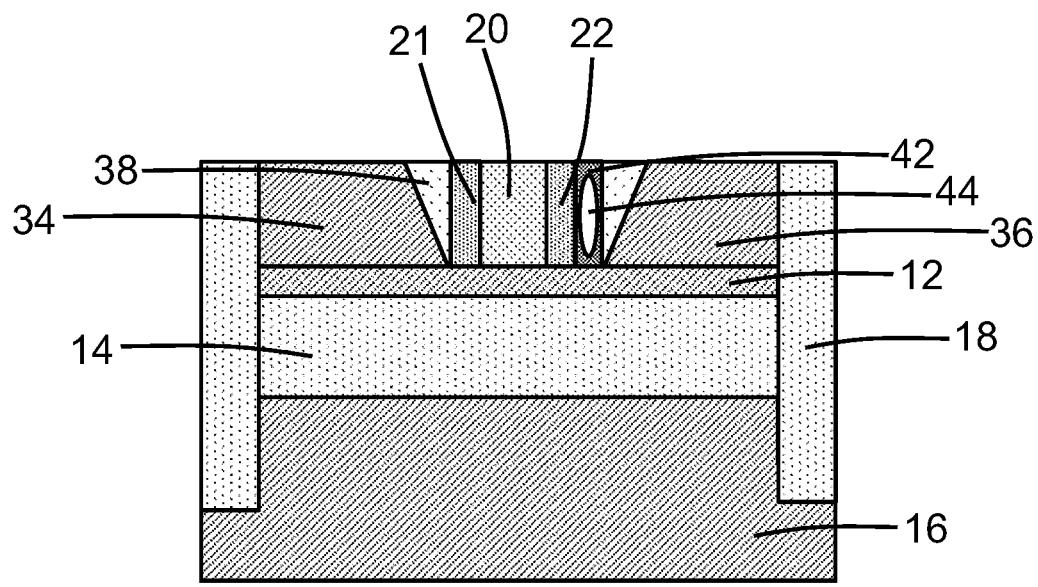

With reference to FIG. 7 in which like reference numerals refer to like features in FIG. 6 and at a subsequent fabrication stage, a layer 42 is deposited that partially fills the cavity 40 and pinches off an entrance to the cavity 40 in order to occlude and seal the entrance to the cavity 40. The layer 42 may be comprised of a dielectric material, such as a low-k dielectric material. In an embodiment, the dielectric material constituting the layer 42 may have a different composition than the dielectric material of the inner spacers 21, 22. In an embodiment, the dielectric material constituting the layer 42 may have the same composition as the dielectric material of the inner spacers 21, 22.

The dielectric material of the layer 42 may surround an airgap 44, which may contain atmospheric air at or near atmospheric pressure, may contain another gas at or near atmospheric pressure, or may contain atmospheric air or another gas at a sub-atmospheric pressure (e.g., a partial vacuum). The airgap 44 may be characterized by a permittivity or dielectric constant of near unity (i.e., vacuum permittivity), which is less than the dielectric constant of a solid dielectric material. The arrangement is asymmetric because the airgap 44 is only located adjacent to one sidewall of the base layer 26.

In an embodiment, the dielectric material of the layer 42 may fully surround and enclose the airgap 44. The dielectric material of the layer 42 and the airgap 44 define a composite spacer that is laterally positioned between the base layer 20 and the raised semiconductor layer 36. In an embodiment, the composite spacer defined by the dielectric material of the layer 42 and the airgap 44 may occupy different portions of the cavity 40. In an embodiment, the composite spacer defined by the dielectric material of the layer 42 and the airgap 44 may fully occupy the cavity 40. The inner spacer 22, which is solid and lacks internal voids, is laterally positioned between the base layer 20 and the composite spacer defined by the dielectric material of the layer 42 and the airgap 44.

Figure 8:
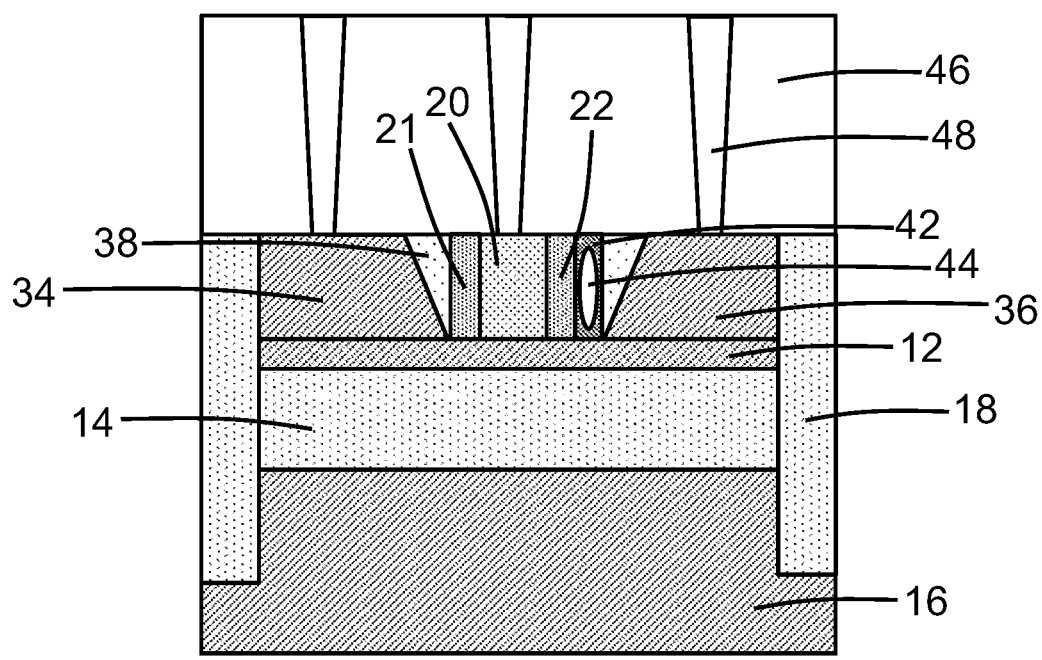

With reference to FIG. 8 in which like reference numerals refer to like features in FIG. 7 and at a subsequent fabrication stage, a silicide layer (not shown) may be formed on the raised semiconductor layers 34, 36 and on the base layer 26. A dielectric layer 46 is deposited and planarized, and contacts 48 are formed that connected to the raised semiconductor layers 34, 36 providing the emitter and collector and to the base layer 26.

The resultant structure is a lateral bipolar junction transistor with an emitter, a base, and a collector formed using a silicon-on-insulator substrate. The positioning of the airgap 44 laterally between the base layer 26 and the raised semiconductor layer 36 (i.e., the collector) may be effective to reduce the base-collector capacitance, which may lead to an improvement in, for example, maximum oscillation frequency (fmax) during device operation.

Figure 9:
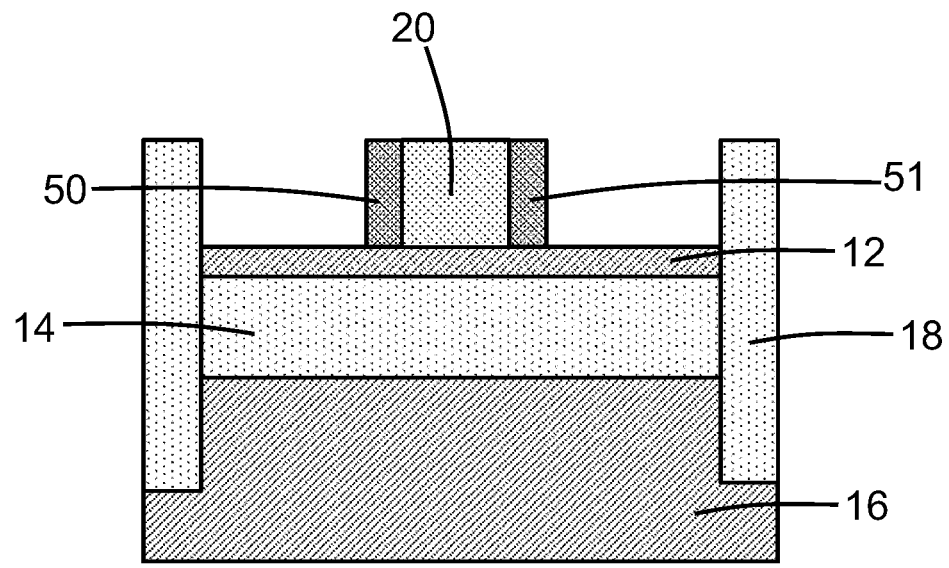
FIGS. 9-13 are cross-sectional views of a structure at successive fabrication stages of a processing method in accordance with alternative embodiments of the invention.

With reference to FIG. 9 and in accordance with alternative embodiments, the base layer 26 of the lateral bipolar junction transistor is formed on the device layer 12. Spacers 50, 51 similar to the outer spacers 23, 24 are formed on the opposite sidewalls of the base layer 26.

Figure 10:
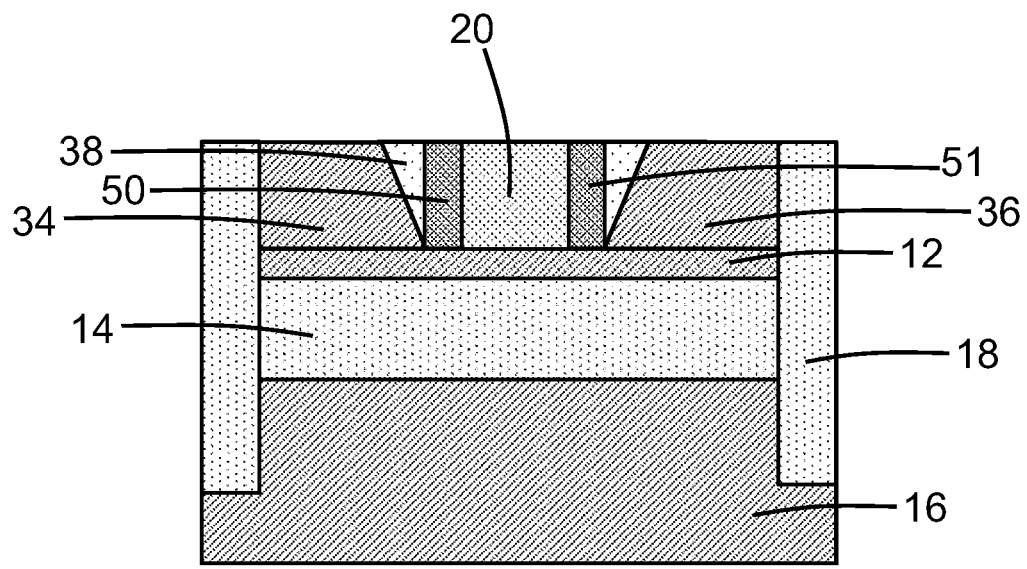

With reference to FIG. 10 in which like reference numerals refer to like features in FIG. 9 and at a subsequent fabrication stage, the raised semiconductor layers 34, 36 are formed, and the gaps between the raised semiconductor layers 34, 36 and the spacers 50, 51 are filled by the dielectric layer 38.

Figure 11:
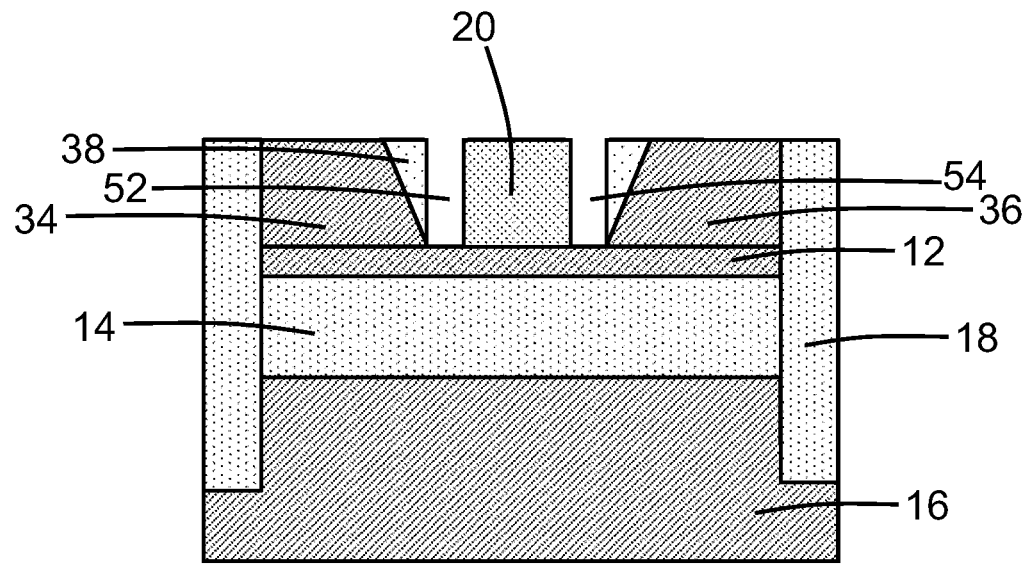

With reference to FIG. 11 in which like reference numerals refer to like features in FIG. 10 and at a subsequent fabrication stage, the spacers 50, 51 are removed to form cavities 52, 54 on both of the opposite sides of the base layer 26. The base layer 26 is laterally positioned between the cavity 52 and the cavity 54.

Figure 12:
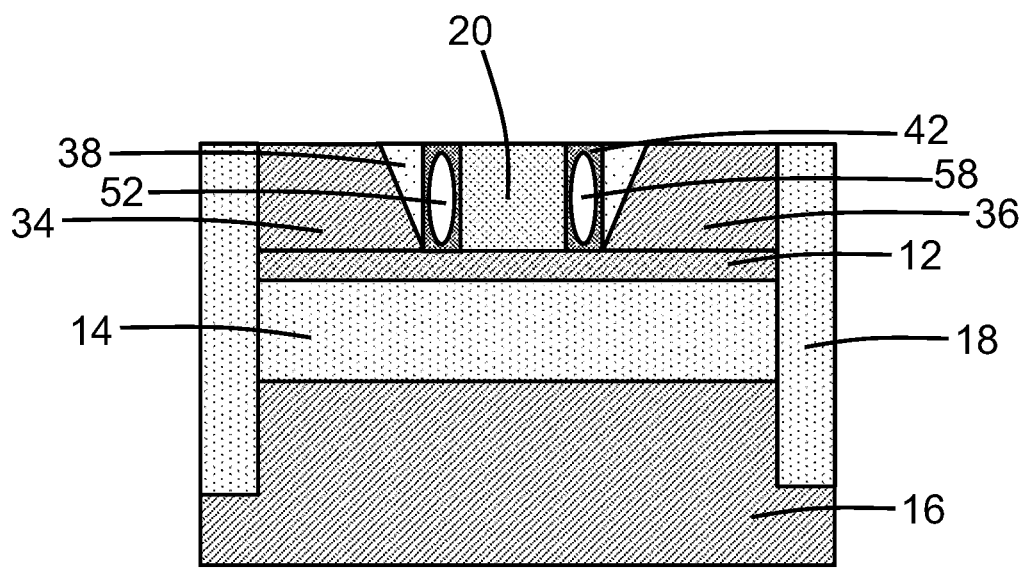

With reference to FIG. 12 in which like reference numerals refer to like features in FIG. 11 and at a subsequent fabrication stage, the layer 42 is deposited that partially fills each of the cavities 52, 54 and pinches off an entrance to each of the cavities 52, 54 in order to occlude and seal the cavities 52, 54. The dielectric material of the layer 42 may surround airgaps 56, 58, which may contain atmospheric air at or near atmospheric pressure, may contain another gas at or near atmospheric pressure, or may contain atmospheric air or another gas at a sub-atmospheric pressure (e.g., a partial vacuum). The airgaps 56, 58 may be characterized by a permittivity or dielectric constant of near unity (i.e., vacuum permittivity), which is less than the dielectric constant of a solid dielectric material. The airgap arrangement is symmetric because one of the airgaps 56, 58 is located adjacent to each sidewall of the base layer 26.

In an embodiment, the dielectric material of the layer 42 may enclose and fully surround the airgap 56. The dielectric material of the layer 42 and the airgap 56 define a composite spacer that is laterally positioned between the base layer 20 and the raised semiconductor layer 34. In an embodiment, the dielectric material of the layer 42 may enclose and fully surround the airgap 58. The dielectric material of the layer 42 and the airgap 58 define a composite spacer that is laterally positioned between the base layer 20 and the raised semiconductor layer 36. In an embodiment, the composite spacers may occupy different portions of the cavities 52, 54. In an embodiment, the composite spacers may fully occupy the cavities 52, 54.

Figure 13:
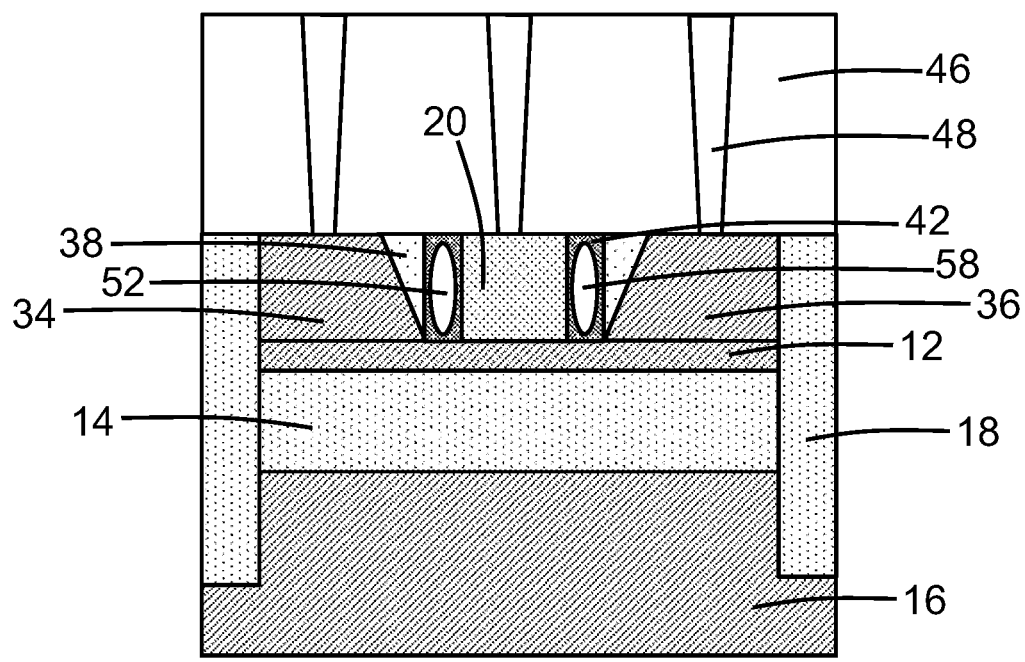

With reference to FIG. 13 in which like reference numerals refer to like features in FIG. 12 and at a subsequent fabrication stage, the dielectric layer 46 are formed, and the contacts 48 connected to the raised semiconductor layers 34, 36 and the base layer 26 are also formed.

The resultant structure is a lateral bipolar junction transistor with an emitter, a base, and a collector formed using a silicon-on-insulator substrate. The positioning of the airgaps 56, 58 laterally between the base layer 26 and both of the raised semiconductor layers 34, 36 may be effective to reduce the base-collector capacitance and the base-emitter capacitance, which may lead to an improvement in, for example, maximum oscillation frequency (fmax) during device operation.

Figure 14:
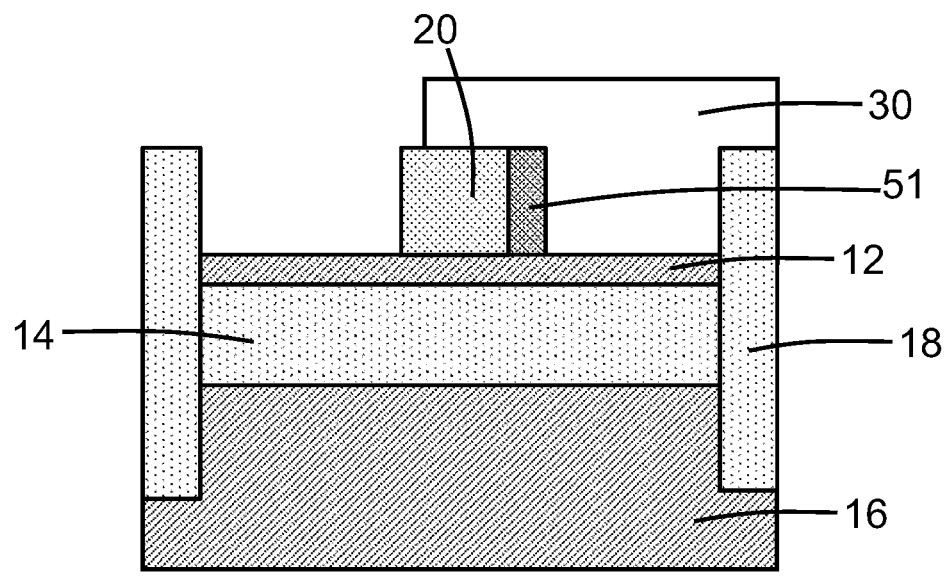
FIGS. 14-15 are cross-sectional views of a structure at successive fabrication stages of a processing method in accordance with alternative embodiments of the invention.

With reference to FIG. 14 and in accordance with alternative embodiments, the etch mask 30 may be applied that covers the spacer 51 on one side of the base layer 26 and that exposes the spacer 50 on an opposite side of the base layer 26. An etching process may be used to remove the exposed spacer 50 without removing the spacer 51. The etch mask 30 may be removed after removing the spacer 50.

Figure 15:
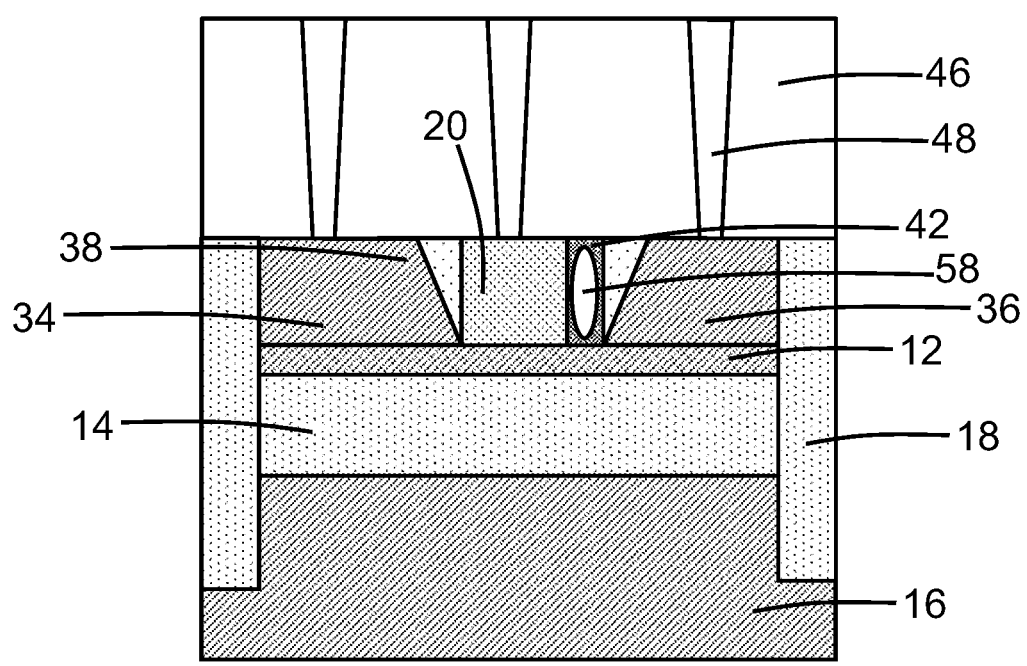

With reference to FIG. 15 in which like reference numerals refer to like features in FIG. 14 and at a subsequent fabrication stage, the raised semiconductor layers 34, 36 are formed, and the gaps between the raised semiconductor layers 34, 36 and the spacers 50, 51 are filled by the dielectric layer 38. The process flow continues as described in connection with FIGS. 11-13. Due to removal of the spacer 50 and the spacer 51 at different fabrication stages of the process flow, only the composite spacer including the airgap 56 and the dielectric material of the layer 42 surrounding the airgap 56 is formed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bipolar junction transistor, the structure comprising:
   a first terminal including a first raised semiconductor layer;
   a second terminal including a second raised semiconductor layer;
   a base layer positioned laterally between the first raised semiconductor layer and the second raised semiconductor layer; and
   a first spacer laterally positioned between the first raised semiconductor layer and the base layer, the first spacer comprising a first dielectric material and a first airgap surrounded by the first dielectric material,
   wherein the first terminal is an emitter of the bipolar junction transistor, and the second terminal is a collector of the bipolar junction transistor.

2. The structure of claim 1 wherein the first airgap is fully surrounded by the first dielectric material.

3. The structure of claim 1 further comprising:
   a device layer comprised of a semiconductor material;
   a substrate; and
   a buried insulator layer separating the device layer from the substrate,
   wherein the first raised semiconductor layer is positioned on a first section of the device layer, and the second raised semiconductor layer is positioned on a second section of the device layer.

4. The structure of claim 3 wherein the first spacer is positioned on the device layer.

5. The structure of claim 1 further comprising:
   a second spacer laterally positioned between the second raised semiconductor layer and the base layer, the second spacer comprising a second dielectric material and a second airgap surrounded by the second dielectric material.

6. The structure of claim 5 wherein the first raised semiconductor layer is spaced from the first spacer by a first gap, the second raised semiconductor layer is spaced from the second spacer by a second gap, and further comprising:
   a dielectric layer in the first gap between the first spacer and the first raised semiconductor layer and in the second gap between the second spacer and the second raised semiconductor layer.

7. The structure of claim 5 wherein the first airgap is fully surrounded by the first dielectric material, and the second airgap is fully surrounded by the second dielectric material.

8. The structure of claim 5 wherein the second dielectric material has the same composition as the first dielectric material.

9. A structure for a bipolar junction transistor, the structure comprising:
   a first terminal including a first raised semiconductor layer;
   a second terminal including a second raised semiconductor layer;
   a base layer positioned laterally between the first raised semiconductor layer and the second raised semiconductor layer; and
   a first spacer laterally positioned between the first raised semiconductor layer and the base layer, the first spacer comprising a first dielectric material and a first airgap surrounded by the first dielectric material,
   wherein the first terminal is a collector of the bipolar junction transistor, and the second terminal is an emitter of the bipolar junction transistor.

10. The structure of claim 1 further comprising:
    a second spacer laterally positioned between the first raised semiconductor layer and the first spacer, the second spacer comprising a second dielectric material different from the first dielectric material.

11. The structure of claim 10 wherein the second spacer is solid.

12. The structure of claim 1 wherein the first raised semiconductor layer is spaced from the first spacer by a gap, and further comprising:
    a dielectric layer in the gap between the first spacer and the first raised semiconductor layer.

13. The structure of claim 12 wherein the dielectric layer comprises a second dielectric material different from the first dielectric material.

14. A method of forming a structure for a bipolar junction transistor, the method comprising:
    forming a base layer;
    forming a first terminal including a first raised semiconductor layer and a second terminal including a second raised semiconductor layer, wherein the base layer is positioned laterally between the first raised semiconductor layer and the second raised semiconductor layer; and
    forming a first spacer laterally positioned between the first raised semiconductor layer and the base layer, wherein the first spacer comprises a first dielectric material and a first airgap surrounded by the first dielectric material,
    wherein the first terminal is an emitter of the bipolar junction transistor and the second terminal is a collector of the bipolar junction transistor, or
    wherein the first terminal is the collector of the bipolar junction transistor and the second terminal is the emitter of the bipolar junction transistor.

15. The method of claim 14 wherein the first airgap is fully surrounded by the first dielectric material.

16. The method of claim 14 further comprising:
    forming a second spacer laterally positioned between the second raised semiconductor layer and the base layer,
    wherein the second spacer comprises a second dielectric material and a second airgap is surrounded by the second dielectric material.

17. The method of claim 14 further comprising:
    forming a second spacer,
    wherein the second spacer is laterally positioned between the first raised semiconductor layer and the first spacer, and the second spacer comprises a second dielectric material different from the first dielectric material.

18. The method of claim 14 wherein forming the first spacer positioned laterally positioned between the first raised semiconductor layer and the base layer comprises:
    removing a second spacer to form a cavity; and
    depositing the first dielectric material inside the cavity.

19. The method of claim 18 wherein the first dielectric material partially fills the cavity to surround the first airgap.

20. The structure of claim 1 further comprising:
a second spacer laterally positioned between the second raised semiconductor layer and the base layer, the second spacer comprising a second dielectric material and a second airgap surrounded by the second dielectric material.

\* \* \* \* \*